United States Patent
Lai et al.

(10) Patent No.: US 8,830,711 B2
(45) Date of Patent: Sep. 9, 2014

(54) HYBRID SWITCH FOR RESONANT POWER CONVERTERS

(75) Inventors: Jih-Sheng Lai, Blacksburg, VA (US); Wensong Yu, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 147 days.

(21) Appl. No.: 13/206,846

(22) Filed: Aug. 10, 2011

(65) Prior Publication Data

US 2012/0057387 A1 Mar. 8, 2012

Related U.S. Application Data

(60) Provisional application No. 61/372,127, filed on Aug. 10, 2010.

(51) Int. Cl.
| | |
|---|---|
| H02M 7/44 | (2006.01) |
| H03K 17/06 | (2006.01) |
| H02M 7/797 | (2006.01) |
| H03K 17/567 | (2006.01) |
| H02M 1/00 | (2006.01) |

(52) U.S. Cl.
CPC ............ *H02M 7/797* (2013.01); *Y02B 70/1441* (2013.01); *Y02B 70/1491* (2013.01); *H03K 17/06* (2013.01); *H02M 2001/0048* (2013.01); *H03K 17/567* (2013.01)
USPC ............................................ 363/98; 363/132

(58) Field of Classification Search
CPC ..................... H02M 7/797; H02M 2001/0048; H03K 17/567; H03K 17/06
USPC .................... 363/17, 132, 131, 97, 98, 21.03, 363/55–56.12; 327/108, 432, 433, 392–396
See application file for complete search history.

(56) References Cited

U.S. PATENT DOCUMENTS

| | | | |
|---|---|---|---|
| 7,741,883 B2* | 6/2010 | Fuller et al. .................... | 327/108 |
| 2005/0040711 A1* | 2/2005 | West ............................... | 307/82 |
| 2006/0220626 A1* | 10/2006 | Partridge ....................... | 323/282 |
| 2012/0057378 A1* | 3/2012 | Fratta ............................. | 363/37 |

OTHER PUBLICATIONS

Klaus Hoffmann, High Frequency Power Switch—Improved Performance by MOSFETs and IGBTs Connected in Parallel, 2005, IEEE, pp. 1-11.*
Sung-Yeul Park, Variable Timing Control for Wide Current Range Zero-Voltage Soft-Switching Inverters, Feb. 2009, IEEE, pp. 407-412.*

* cited by examiner

*Primary Examiner* — Gary L Laxton
*Assistant Examiner* — Kyle J Moody
(74) *Attorney, Agent, or Firm* — Whitham, Curtis, Christofferson & Cook, P.C.

(57) ABSTRACT

A hybrid switch comprising two semiconductor switches connected in parallel but having different voltage drop characteristics as a function of current facilitates attainment of zero voltage switching and reduces conduction losses to complement reduction of switching losses achieved through zero voltage switching in power converters such as high-current inverters.

17 Claims, 5 Drawing Sheets

HYBRID SWITCH FOR RESONANT POWER CONVERTERS

CROSS-REFERENCE TO RELATED APPLICATIONS

This application claims benefit of priority of U.S. Provisional Application 61/372,127, filed Aug. 10, 2010, which is hereby incorporated by reference in its entirety.

STATEMENT OF GOVERNMENT INTEREST

This invention was made with government support under Contract No. DE-FC26-07NT43214 awarded by the Department of Energy. The U.S. Government may have certain rights in this invention.

FIELD OF THE INVENTION

The present invention generally relates to semiconductor devices capable of switching high currents and, more particularly, to a hybrid switching device or circuit particularly suited for use in high power switching circuits such as resonant power converters to increase the efficiency thereof.

BACKGROUND OF THE INVENTION

At the present time, most power distribution is achieved using high voltage alternating current (AC) such that resistive losses in long power distribution lines can be reduced to acceptable levels. Alternating current allows high voltage power at reduced currents to be converted to a lower voltage and higher current near the location where the power will be consumed by the simple expedient of a transformer. However, most electronic devices or other apparatus that includes such electronic devices as well as power storage devices such as batteries require direct current (DC) power at a closely regulated voltage. DC power can be easily obtained from AC power by rectification using diodes or the like and filtering to obtain an approximate DC voltage from which the required DC voltage may be obtained. Maintaining a DC voltage at a particular desired level within a small tolerance, however, generally requires regulation by an active circuit since practical filters generally cannot hold a DC voltage within tolerances generally required by electronic devices.

While analog voltage regulators have been known for many years, they are inefficient to provide any significant current because of the voltage drop developed across them and the power they consume for that reason. Accordingly, at the present time, switching regulators and power converters such as inverters are much preferred because of the increased efficiency they can potentially provide by rapidly connecting and disconnecting the power input thereto as required to maintain the output voltage at a desired level. Thus, the period when a voltage drop occurs across the regulator or power converter will be limited to relatively short periods of time and overall efficiency can be improved.

However, such switching is necessarily cyclic and some portions of the switching cycle may be less efficient than others due to the instantaneous conduction conditions in the regulator or power converter circuit. The amount of current passing through the regulator or power converter can vary widely over a single switching cycle and between switching cycles, depending on input voltage or output current.

For example, at light loads where conduction losses are reduced, the amount of power consumed by the rapid switching, referred to as switching losses, becomes a significant fraction of the total power consumption of the regulator or power converter. Switching losses can be substantially eliminated by so-called soft switching using MOSFETs such that the internal diode (referred to as a body diode) of the MOSFET will begin to conduct before the MOSFET is switched on. Conversely, at heavy loads where high current is drawn through the regulator or power converter, conduction losses in the switches, generally MOSFETs since they are well-suited to operation in a soft-switching mode, tend to predominate because the conduction path in MOSFETs is substantially resistive. Conduction losses theoretically could be mitigated by placing a large number of MOSFETs in parallel to reduce currents in individual MOSFETs and thus reduce the voltage drop. However such a parallel connection of many switches is not generally practical due to the cost of multiple switching devices.

Other attempts to improve efficiency of switching devices in regulators and power converters by control of mode of operation have yielded only marginal improvements. Such attempts to tailor mode of operation to load levels are necessarily complex, increasing cost and reducing power density and require some amount of power for operation as well as load sensing. Further, such arrangements have not been able to alter modes of operation within a single switching cycle.

Some of the above causes of inefficiency are particularly intractable in regard to high power inverters which produce AC current from DC input power. While inverters have been known, particularly for low-power applications, they have become of increasing interest in recent years in connection with renewable or so-called "green" energy sources such as solar power or wind-powered generators where conditions for generation of power is necessarily intermittent and energy must be stored in some form such as charge in batteries. Energy stored in such a manner will necessarily be available as a DC voltage which may require conversion to AC power for distribution.

Thus, the inverter output voltage and current will ideally vary sinusoidally at the desired line frequency and the current through the switches on each side of the inverter circuit will vary from zero to a maximum and back to zero during respective half-cycles of the line frequency with the maximum current depending ultimately on the load. Thus, it can be clearly seen that the full range of output current that may be required by the load will be carried by the respective switches of the inverter during respective half-cycle periods of the output and improvements in efficiency have been limited since both light and heavy loads must be accommodated in a single half-line cycle.

SUMMARY OF THE INVENTION

It is therefore an object of the present invention to provide a hybrid switch of improved efficiency that minimizes voltage drop across the hybrid switch at both heavy and light loads without requiring load sensing or control of mode of operation.

It is another object of the invention to provide inverter circuits of improved efficiency using a hybrid switch to reduce voltage drop across the switches of the inverter under all load conditions.

In order to accomplish these and other objects of the invention, a hybrid switch and a power converter such as an inverter are provided, wherein the hybrid switch comprises an insulated gate bipolar transistor (IGBT), and a power MOSFET, wherein conduction terminals of said IGBT and Said power MOSFET are connected in parallel, and wherein control terminals of said IGBT and said power MOSFET are responsive to a control signal.

In accordance with another aspect of the invention, a method of reducing conduction losses in a high current switching circuit is provided comprising controlling two switches to conduct concurrently, wherein one of the two switches exhibits a substantially resistive voltage drop as a function of current and another of the two switches exhibits a substantially constant voltage drop plus a small resistive voltage drop characteristic as a function of current, wherein conduction current is shared between switches in accordance with their respective voltage drop characteristics.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
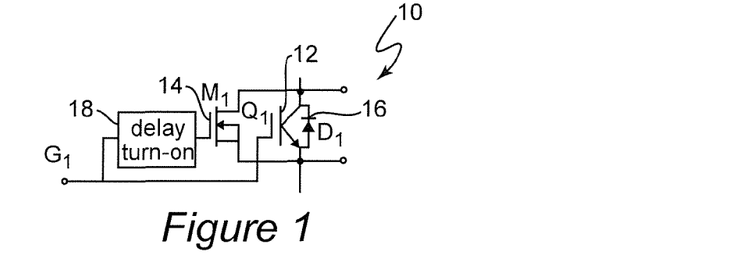
FIG. 1 is a schematic diagram of a hybrid switch in accordance with the invention.
Figure 4:
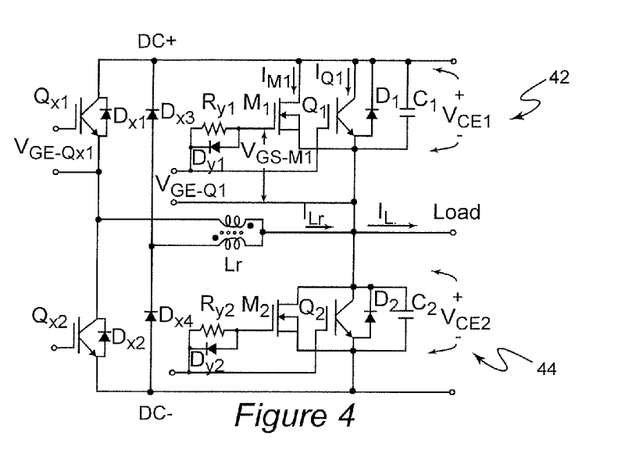
FIG. 4 is a schematic diagram of a phase leg of a coupled-magnetic type of soft-switching inverter employing the hybrid switch of FIG. 1.

Referring now to the drawings, and more particularly to FIG. 1, there is shown a schematic diagram of the hybrid switch 10 in accordance with the invention. The hybrid switch 10 essentially comprises a power insulated gate bipolar transistor (IGBT—Q1) 12 and a power MOSFET 14 (M1) having the conduction terminals and control terminals of both transistors essentially connected in parallel. For soft switching, the IGBT will also preferably have a diode D1 (16) connected in parallel with the conduction terminals thereof. MOSFET 14 inherently includes a similarly connected diode referred to as a body diode. Both transistors are controlled by the same signal G1 although it is preferred and generally necessary in very high voltage, high power applications to provide a turn-on delay 18 in the application of signal G1 to MOSFET 14 as will be discussed in greater detail below. No delay is generally required for turn-off of MOSFET 14 (M1) and the delay structure 18 can be as simple as a series resistor (e.g. in series with the gate capacitance of MOSFET 14) with a diode connected in parallel with the resistor to quickly discharge the gate capacitance, as shown in the circuit of FIG. 4. However, a delay can also be applied to turn-off by adding a resistor in series with the diode Dy1 and/or Dy2.

Figure 2:
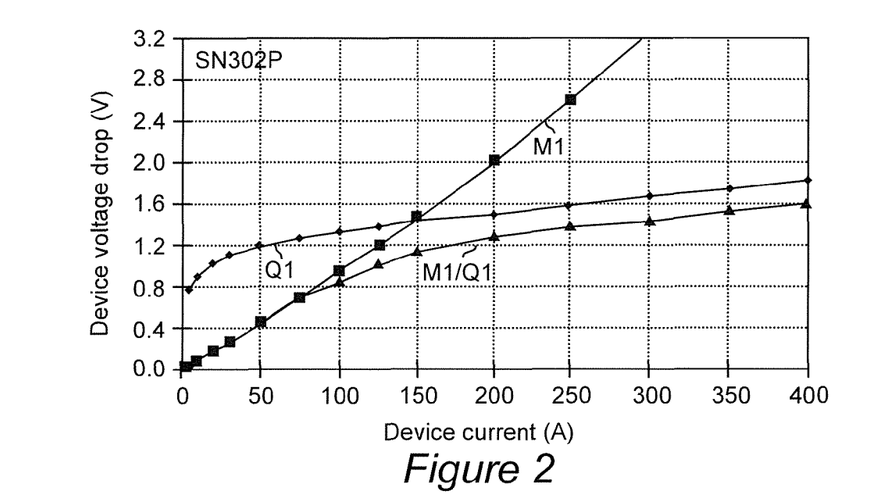
FIG. 2 is a graph depicting voltage drop across the hybrid switch of FIG. 1 as a function of current through the hybrid switch.

The basic principle of operation of hybrid switch 10 can be readily understood from FIG. 2 which is a plot of the forward voltage drop of the MOSFET 14 (M1) and the IGBT 12 (Q1) and the parallel combination thereof (M1/Q1). As can be seen, the forward voltage drop characteristic of the MOSFET M1 is essentially linear with current and thus is essentially resistive as is to be expected since there is no junction in the conduction path of a field effect transistor. The forward voltage drop characteristic of a power IGBT is a constant for even minimal forward current plus an additional and near-negligible voltage that rises with increase of forward current although not linearly at relatively low currents and rises less with increased current than the forward voltage drop of a MOSFET.

Since the characteristics illustrated in FIG. 2 are plots of the voltage drop as a function of forward current, they represent a comparison of resistances at a continuum of currents and, as is known, current will be apportioned between parallel conduction paths in inverse proportion to the relative resistances of the parallel conduction paths. Therefore, at low current where the M1 resistance is much lower than the Q1 resistance, conduction through MOSFET 14 will predominate. As the resistances become more similar (at about 75 Å in this example) conduction will be shared between IGBT 12 and MOSFET 14 and will be equal when the resistances are equal (at 150 A in this example). Above that point greater current will be carried by the IGBT until (above about 200 A in this example) the current through MOSFET 14 becomes relatively small and the M1/Q1 curve becomes substantially parallel to the Q1 curve. The M1/Q1 curve will always lie below the Q1 curve since the parallel conduction path through the MOSFET will always exist and, even though the resistance can become relatively high for larger currents, it will not become infinite (which would cause the M1/Q1 curve to converge with the Q1 curve but not cross it) while the MOSFET is turned on and remains intact. It follows from the M1/Q1 curve being below the Q1 curve and never exceeding the M1 curve, that the hybrid switch 10 will have a lower voltage drop across it than would be developed at any forward current than either the IGBT or MOSFET alone except at very low currents where the conduction losses in the MOSFET would be very small. Therefore, the efficiency of the hybrid switch will be greater than either a MOSFET or an IGBT at large currents and equal to the small conduction losses of the MOSFET at very low currents. Further, the relative conduction currents in the IGBT 12 and the MOSFET 14 will inherently shift between the IGBT and MOSFET depending on the current drawn by the load.

It should be appreciated, however, that such a simple expedient for significantly increasing efficiency is not appropriate for hard-switching inverters because when turning on the switch on one side of the inverter, the switch on the other side of the inverter which includes the body diode of the power MOSFET must be turned off. The reverse recovery time of the body diode of a high power MOSFET is very slow and a large reverse diode current will create a short circuit between DC+ and DC−, resulting in a large loss or even failure of the hybrid switch 10.

In sharp contrast, with soft switching (e.g. using either an IGBT and diode or a power MOSFET having a body diode), the diode current is always diverted to the diode on the opposite side of the inverter before the switch on the opposite side of the inverter is turned on to allow the switch to be turned on under a zero voltage condition. In this case, the slow reverse recovery is not an issue and a hybrid switch in accordance with the invention can be adopted for most zero voltage switching inverters even though such a possibility is clearly counter-intuitive in regard to the design of most currently available high-power inverters which employ hard switching.

As alluded to above, the only concern regarding use of the hybrid switch in accordance with the invention in soft-switching inverters is the possibility during the turn-on process of the hybrid switch that most load current may flow through the power MOSFET and cause transient over current therein. This concern can be completely answered by the inclusion of turn-on delay circuit 18 which, as alluded to above, may be very simple and inexpensive to provide. Since the delay and the corresponding diversion of some current through the IGBT can be very short, the brief increase in forward conduction voltage drop does not significantly compromise the reduction in conduction loss that is achieved by use of the hybrid switch in accordance with the invention. It can also be appreciated from the foregoing discussion that the need for a corresponding delay in turn-off of the MOSFET depends of the proportion of MOSFET and IGBT sizes In general, the turn-off of IGBT 12 and MOSFET 14 can occur simultaneously and a corresponding turn-off delay is unnecessary. However, if MOSFET 14 carries the majority of the load current under most load conditions, then a delayed turn-off of the MOSFET can reduce the turn-off loss of the IGBT which tends to have a slow turn-off, sometimes referred to as a "tail current, as is well-known.

Figure 3:
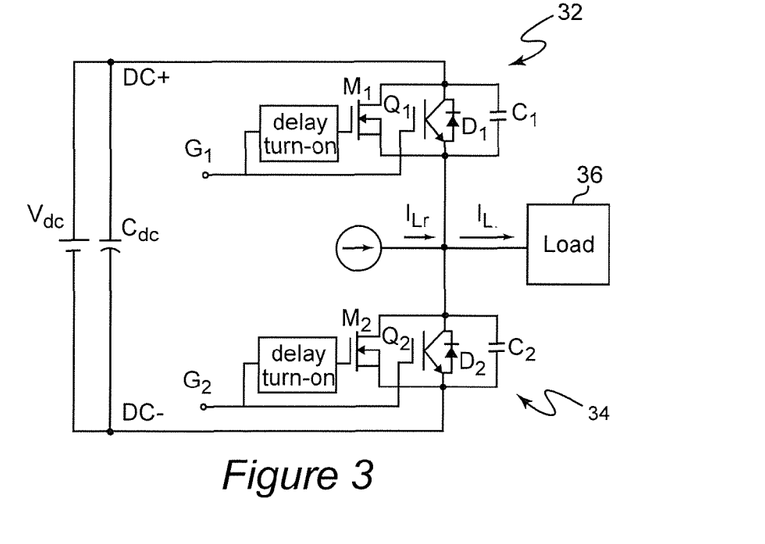
FIG. 3 is a schematic diagram of a soft-switching inverter employing the hybrid switch of FIG. 1.

Referring now to FIG. 3, the first of several exemplary inverter circuits employing the hybrid switch of the invention will now be discussed. It should be understood that these exemplary inverter circuits and corresponding use of the hybrid switch in other zero voltage switching inverters are considered to be within the scope of the present invention.

As illustrated in FIG. 3, the inverter circuit principally comprises two switches 32, 34, which alternately connect the DC+ and DC− busses, which receive power from a power supply, battery or the like, generically illustrated as $V_{dc}$ and $C_{dc}$, to the load 36. (The current return path from the load is not shown.) The upper switch comprises M1, Q1 and D1 and the lower switch comprises M2, Q2 and D2. In a conventional hard-switching inverter, only IGBTs Q1 and Q2 and diodes D1 and D2 are used. IGBT Q1 conducts the positive current, while diode D1 conducts the negative freewheeling current. Similarly, IGBT Q2 conducts the negative current, while D2 conducts the positive freewheeling current. With added MOSFETs M1 and M2, the positive currents are shared between M1 and Q1 and the negative currents are shared between M2 and Q2 while the positive and negative freewheeling currents are shared between the diodes D1, D2 and the body diodes of the MOSFETs M1 and M2, respectively. Only one gate signal is required for each switch: G1 for the upper switch and G2 for the lower switch. The auxiliary resonant current $I_{lr}$ can be created by an auxiliary circuit that comprises additional auxiliary switches such as Qx! and Qx2 and auxiliary diodes Dx3 and Dx4 and a resonant inductor as shown in FIG. 4. Resonant capacitors C1 and C2 are preferably connected across the respective switches 32, 34, to reduce the device voltage slew rate and consequent turn-off losses.

The soft-switching inverter circuit of FIG. 3 is perhaps the simplest and most generalized inverter circuit possible and its operation will be readily understood by those skilled in the art. Similarly, from the above discussion in connection with FIGS. 1 and 2, it can be readily appreciated that the reduction of voltage drop across the hybrid switches (compared with the conventional circuit in which only the IGBTs Q1 and Q2 are used) will significantly improve efficiency when any significant current is drawn by the load and particularly at light loads which will occur near the times when the on-state is reversed between switches 32 and 34.

As a second example of the use of hybrid switches 10 in an inverter circuit, a phase leg of a coupled-magnetic type soft-switching inverter is schematically illustrated in FIG. 4. This Figure represents an exemplary type of implementation of the basic circuit of FIG. 3. As alluded to above, the turn-on delay is illustrated as being simply implemented with resistors $R_{y1}$ and $R_{y2}$ which slows charging of the gate capacitances of the MOSFETs M1 and M2. Since no turn-off delay is needed, a diode is provided in parallel with each of the resistors.

Transistors Qx1 and Qx2 are auxiliary switches to produce the resonant current, $I_{lr}$, as depicted more generically in FIG. 3. Dx1 and Dx2 are small diodes that protect IGBTs Qx1 and Qx2 from any negative voltage failure. Two resonant inductors are coupled together. The inductor that connects between the middle point of switches Qx1 and Qx2 and the middle point of hybrid switches 42 and 44 is considered the primary side, and the inductor that connects between the middle point of diode Dx3 and Dx4 and the middle point of hybrid switches 42 and 44 is considered the secondary side. The voltages controlling the IGBTs and MOSFETs and IGBT and MOSFET currents are also illustrated and will be discussed in connection with the operational waveforms shown in FIG. 5.

Figure 5A:
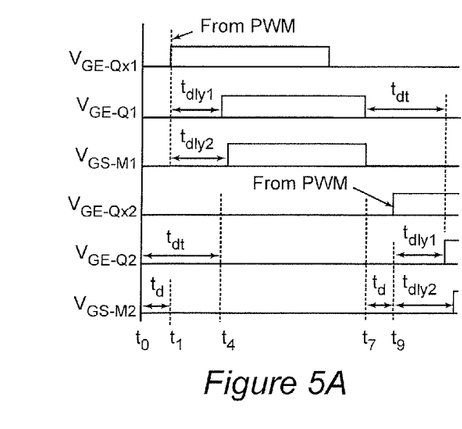
FIG. 5 illustrates a timing diagram and key waveforms of the circuit of FIG. 4.
Figure 5B:
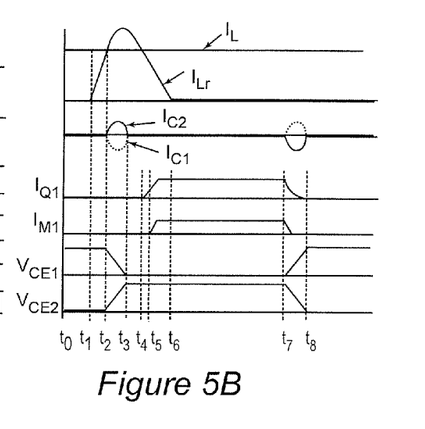

Referring now to FIG. 5, the timing and operational waveforms of the circuit of FIG. 4 will be discussed in detail. It will be appreciated that these timing and operational waveforms are also applicable to some applications of the circuit of FIG. 3. It is assumed that the load current $I_L$ is initially positive (appearing constant over the short time period depicted) and conducted by the bottom freewheeling diode D2. At time t0, the bottom main hybrid switch 44 gates $V_{GE-Q2}$ and $V_{GE-M2}$ turn off. Because their anti-paralleled diodes conduct initially, the turn-off action does not create any change in the voltage and current waveforms. At time t1, the upper auxiliary switch gate $V_{GE-Qx1}$ is turned on by, for example, a pulse width modulation (PWM) command. The auxiliary switch Qx1 conducts and produces a resonant current $I_{lr}$ which initially rises linearly with a slope proportional to the bus voltage and anti-proportional to the inductance of the coupled magnetics. At time t2, $I_{lr}$ exceeds the load current and the excess portion will charge and discharge the resonant capacitors C1 and C2, respectively. With C1 being discharged, top switch voltage $V_{CE1}$ starts falling and with C2 being charged, bottom switch voltage $V_{CE2}$ starts rising. At time t3, C1 and c2 are fully discharged and charged, respectively, $V_{CE1}$ falls to zero and M1 and Q1 can be turned on under zero voltage conditions. At time t4 the main switch Q1 gate $V_{GE-Qx1}$ is turned on by the control circuit. The delay between T1 and t4, $t_{dly}$, can be controlled by a fixed delay timer or by zero-voltage detection. The load current starts shifting to Q1 and $I_{Q1}$ starts rising. At time T5, a small delay following t4 to avoid M1 from initially carrying too much current, as discussed above, the MOSFET switch M1 gate is turned on and the load current will be shared by both M1 and Q1. With both M1 and Q1 conducting, the secondary winding of the coupled magnetics will see a reverse voltage due to Dx4 conducting. The resonant current will be reset by this reverse voltage. At time t6, the resonant current $I_{lr}$ falls to zero. The slope of the resonant current falling rate depends on the secondary inductance of the coupled magnetics. With a turns ratio larger than 1, the slope can be more gentle and the zero-voltage crossing period can be widened.

At time t7, both M1 and Q1 are turned off. Diode Dy1 helps accelerate discharging the gate-source capacitance of M1 to avoid the load current being shifted to M1, which is generally a smaller device than the corresponding IGBT and designed to carry a smaller current. The currents in both M1 and Q1 start shifting out to charge and discharge C1 and C2. With C1 being charged, top switch voltage $V_{CE1}$ starts rising and with C2 being discharged, bottom switch voltage $V_{CE2}$ starts falling. At time t8, capacitor C1 is fully charged and $V_{CE1}$ rises to the DC bus voltage and capacitor C2 is fully discharged and $V_{CE2}$ falls to zero, while the load current is conducted by the bottom freewheeling diode D2. At time t9, the bottom auxiliary switch is turned on by a PWM command. With bottom freewheeling diode D2 conducting, the voltage across the coupled magnetic is zero, so the resonant current cannot be established, Also, with VCE2 being zero, the bottom switch gate signals $V_{GE-Q2}$ and $V_{GE-M2}$ can be turned on under zero voltage conditions. The process is then repeated for the bottom side of the inverter circuit.

Figure 6:
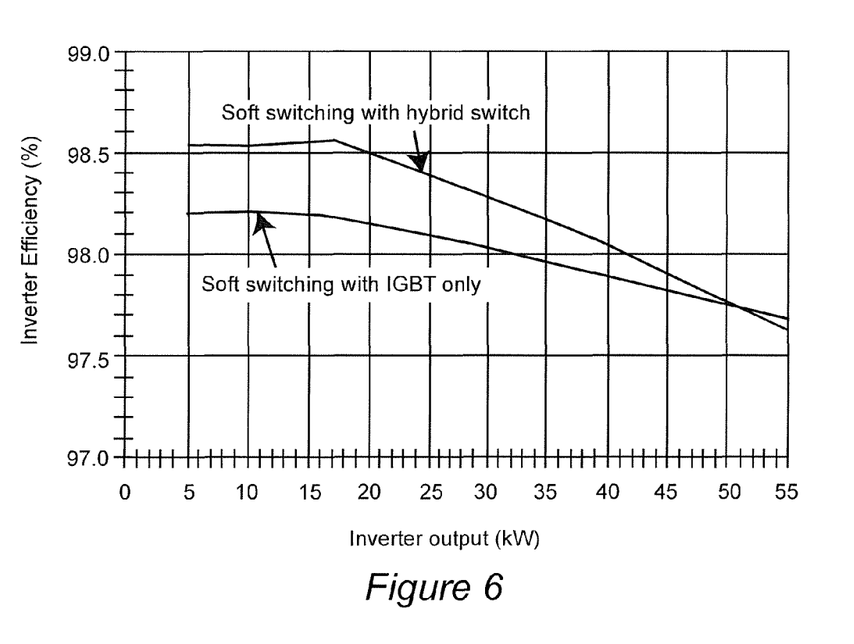
FIG. 6 is a graphical comparison of the efficiency of the circuit of FIG. 4 using the hybrid switch in accordance with the invention and an insulated gate bipolar transistor alone

FIG. 6 is a graphical comparison between use of the hybrid switch in accordance with the invention and a comparable conventional circuit using only IGBTs as the main switches in a simulation of a three phase 55 kW coupled magnetic type inverter such as that described above in connection with FIGS. 4 and 5. The simulation conditions assume both inverters use the same amount of silicon area for the IGBT and the hybrid switch in accordance with the invention. At full load conditions, the efficiency is approximately the same, as would be expected where the IGBTs carry the principal current when the hybrid switch is used. However, the inverter using the hybrid switch shows a significant conduction loss reduction/efficiency gain under lesser load conditions.

Figure 7:
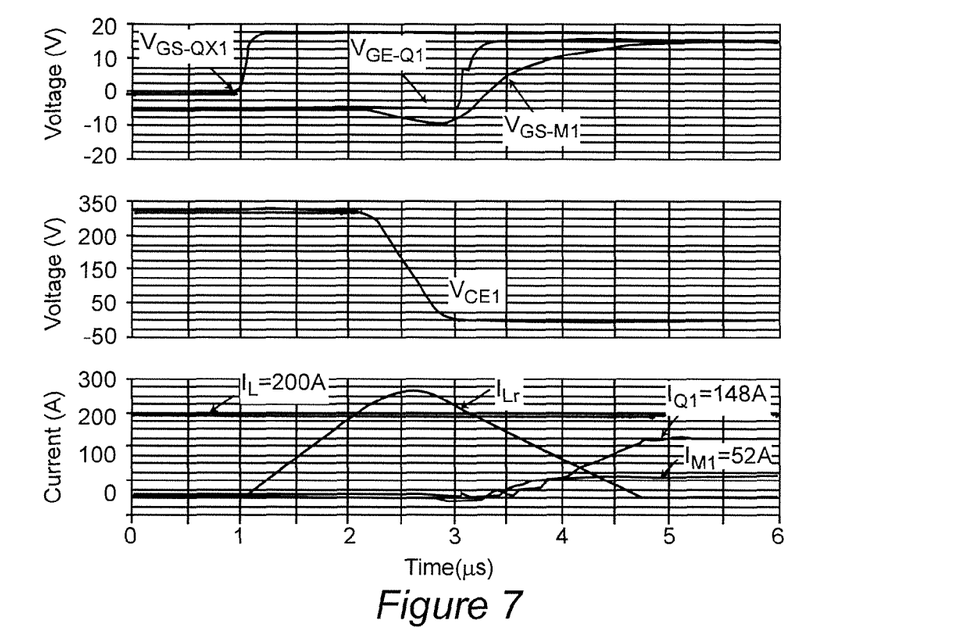
FIG. 7 illustrates simulated waveforms of the circuit of FIG. 4 for high current conditions.

FIG. 7 shows simulated voltage and current waveforms under $V_{dc}$=325 v and $I_L$=200 A using the circuit of FIG. 4. The upper window shows the auxiliary switch gate signals $V_{GE-Qx1}$ is turned on at t=1 μsec. The bottom window indicates that the resonant current starts rising at T=2 μsec and the $I_{lr}$ exceeding $I_L$ as discussed above. The middle window indicates the $V_{CE1}$ starts falling due to its paralleled capacitor being discharged. At about t=3 μsec, $V_{CE1}$ drops to zero and the gates of the upper main switch 42 are turned on under zero voltage conditions. When fully conducting, IGBT Q1 shares the majority of the current, 148 A, while the MOSFET M1 carries a smaller portion of the current. The proportion division of the current depends of the respective voltage drops of the IGBT and the MOSFET when the voltage drops are balanced and, as discussed above, such a balance will be affected by load current.

Figure 8:
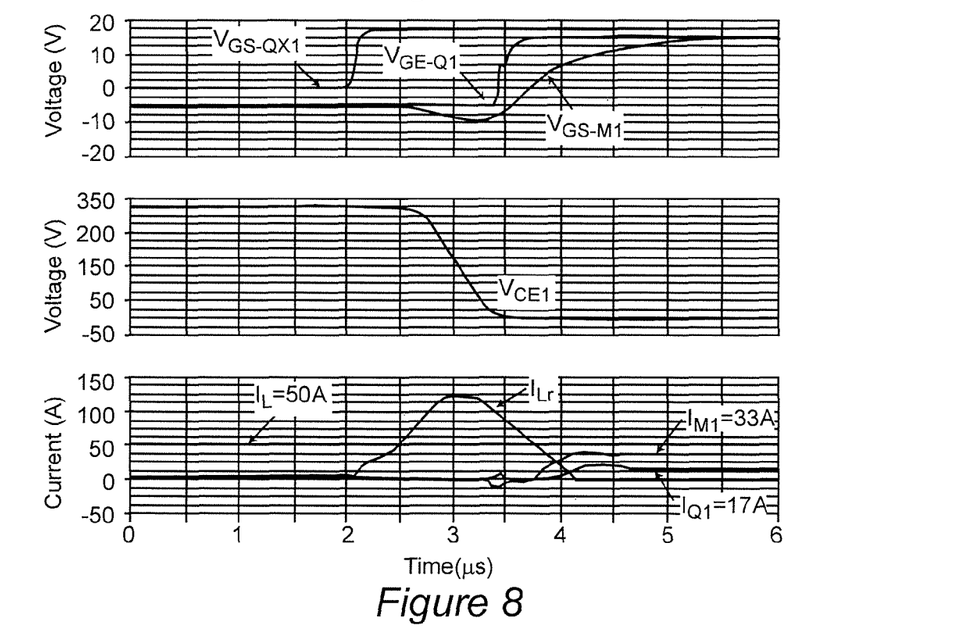
FIG. 8 illustrates simulated waveforms of the circuit of FIG. 4 for reduced current conditions.

To explain the current sharing further, voltage and current waveforms of a simulation with a lower (50 A) load current is shown in FIG. 8. The bottom window shows that the MOSFET M1 carries the majority of the current (33 A) while the IGBT carries a lesser current (17 A) under lighter load conditions due to the principally resistive voltage drop of the MOSFET being reduced at lower current compared to the substantially fixed voltage drop of the IGBT, as discussed above. It should be appreciated that these simulations are in good agreement with the timing and operational waveforms discussed above in connection with FIG. 5.

Figure 9:
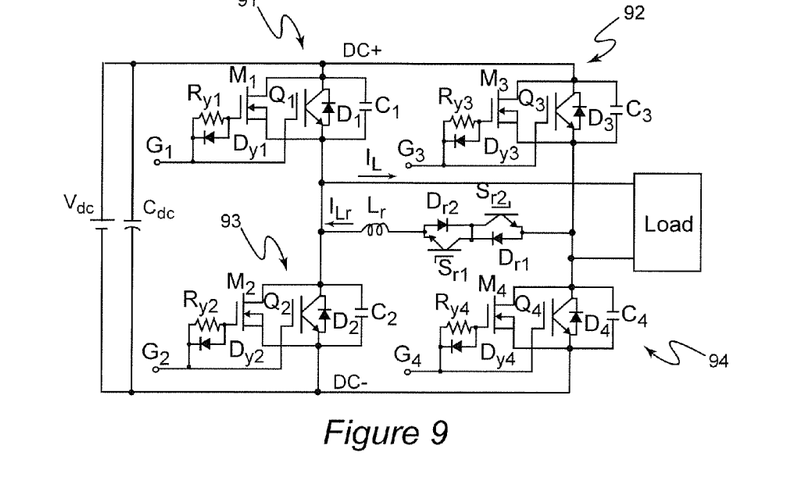
FIG. 9 is a schematic diagram of a single phase resonant snubber inverter using the hybrid Switch of FIG. 1.

The hybrid switch is usable in virtually any soft-switching inverter, regulator or power converter. For example, FIG. 9 schematically shows a full-bridge resonant snubber inverter (RSI) circuit including hybrid switches in accordance with the invention. In this case, the auxiliary resonant current is created by the other phase switches along with the auxiliary circuit that comprises Sr1 and Sr2, auxiliary diodes Dr1 and Dr2 and resonant inductor Lr.

The full bridge operation is to have hybrid switches 91 and 94 turning on and off simultaneously (with slight turn-on delay for the MOSFETs of each hybrid switch) for the positive load current and hybrid switches 92 and 93 turning on and off simultaneously (with the same slight turn-on delay for the MOSFETs) for the negative load current. To achieve soft switching for switches 91 and 94, the resonant current relies on the turning on of auxiliary switch Sr1 which creates a positive current to discharge C1 and C4 so that switches 91 and 94 can be turned on under zero voltage conditions. Similarly, for the negative current cycles, the negative resonant current relies on the turning on of auxiliary switch Sr2 to discharge C2 and C3 to achieve soft switching for switches 92 and 93.

Figure 10:
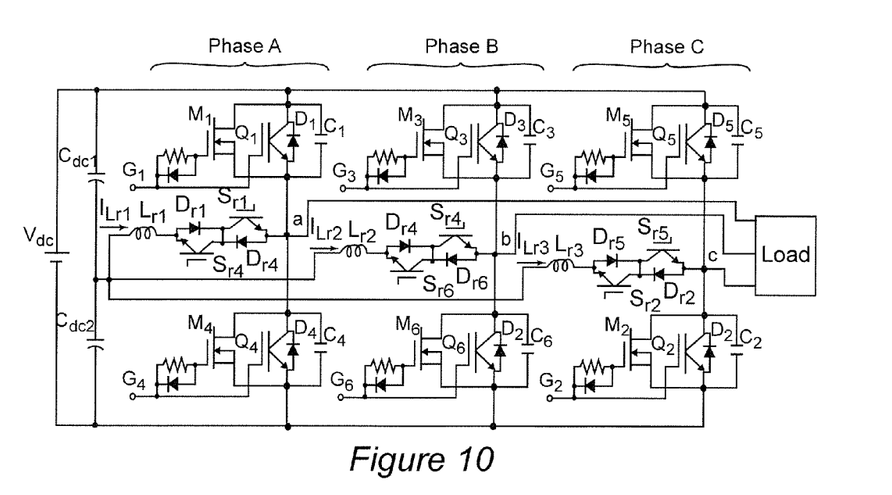
FIG. 10 is a schematic diagram of a three-phase auxiliary commutated resonant pole inverter using the hybrid switch of FIG. 1.

FIG. 10 illustrates application of the hybrid switch in accordance with the invention in a three-phase auxiliary commutated resonant pole inverter. The split capacitors Cdc1 and Cdc2 form a middle point voltage which can be used to create the resonant current when an auxiliary switch is turned on. For example, when Sr1 turns on, a resonant current flows through Lr1, Dr1 and Sr1 to create $I_{Lr1}$ When $I_{Lr1}$ is larger than the corresponding load current, C1 will be discharged and switches 91 and 94 can be turned on under zero voltage conditions. Otherwise, the operation is similar to that described above in regard to FIG. 5 and will be apparent to those skilled in the art in view thereof.

In view of the foregoing, it is seen that the hybrid switch in accordance with the basic principles of the invention facilitates design and operation of soft switching power regulator and converters and power inverters in particular while providing a significant improvement in light load efficiency in any such application. The hybrid switch can be embodied as discrete devices or a three (or four—for connecting an external delay or control) terminal switch package.

While the invention has been described in terms of a single preferred embodiment, those skilled in the art will recognize that the invention can be practiced with modification within the spirit and scope of the appended claims.

The invention claimed is:

1. A soft switching power converter including two series connected hybrid switches, each said hybrid switch comprising
    an insulated gate bipolar transistor (IGBT), and
    a power MOSFET, wherein
    conduction terminals of said IGBT and said power MOSFET are connected in parallel, and wherein
    a control terminal of said IGBT is responsive to a control signal, and
    a delay circuit connected to a control terminal of said power MOSFET whereby said power MOSFET is responsive to said control signal to turn on after a delay; said hybrid switch diverting current through said IGBT during said delay, said power converter further comprising
    an auxiliary resonant current source connected to a node connecting said two series connected hybrid switches which does not deliver load current.

2. The power converter as recited in claim 1 further including
    a delay circuit for delaying application of said control signal to said MOSFET such that turn-off of said MOSFET is delayed relative to turn-off of said IGBT.

3. The power converter as recited in claim 1, wherein said power converter is an inverter.

4. The power converter as recited in claim 3, wherein said inverter is a phase leg circuit.

5. The power converter as recited in claim 4, wherein said power converter includes multiple phases.

6. The power converter as recited in claim 3, wherein said inverter is a half bridge circuit.

7. The power converter as recited in claim 3, wherein said inverter is a full bridge circuit.

8. The power converter as recited in claim 3, wherein said inverter comprises a three-phase bridge circuit.

9. The power converter as recited in claim 1, wherein said resonant current source comprises
a first transistor,
a second transistor connected in series with said first transistor, and
an inductor connected in series with at least one of said first transistor and said second transistor.

10. The power converter as recited in claim 9, further comprising
a capacitor connected in parallel with each said hybrid switch.

11. The power converter as recited in claim 9, wherein said inductor comprises two inductor windings that are electrically connected and magnetically coupled to each other.

12. The power converter as recited in claim 9, further including two additional hybrid switches connected to said two hybrid switches in a full bridge circuit.

13. The power converter as recited in claim 9, wherein said resonant circuit is also connected to a node at the mid-point of a capacitive voltage divider.

14. A method of reducing conduction losses in a high current switching circuit comprising steps of
controlling two hybrid switches to conduct alternately, wherein each of said hybrid switches comprise two switches which are controlled to conduct concurrently, wherein one of said two switches exhibits a substantially resistive voltage drop as a function of current and another of said two switches exhibits a substantially constant voltage drop plus a reduced resistive voltage drop characteristic as a function of current compared to said resistive voltage drop as a function of current compared to said one of said switches, wherein conduction current is shared between said two switches in accordance with respective voltage drop characteristics of said two switches during a period said switches are controlled to conduct concurrently,
delaying turn-on of said one of said switches that exhibits said substantially resistive voltage drop as a function of current for a delay period relative to turn-on of said another of said switches that exhibits said substantially constant voltage drop plus a reduced voltage drop compared to said one of said switches, whereby current is diverted through said another of said switches during said delay period, and
applying a resonant current to a node connecting said two hybrid switches in series.

15. The method as recited in claim 14, wherein said two hybrid switches form a half-bridge circuit.

16. The method as recited in claim 14, wherein two additional hybrid switches are controlled to conduct alternately in a full bridge circuit.

17. The method as recited in claim 14, wherein said two hybrid switches form a phase leg of a multi-phase power converter.

* * * * *